United States Patent
Hsu et al.

(10) Patent No.: US 9,165,667 B2
(45) Date of Patent: Oct. 20, 2015

(54) ELECTRONIC DEVICE WITH SOLID STATE DRIVE AND ASSOCIATED CONTROL METHOD

(71) Applicant: LITE-ON TECHNOLOGY CORPORATION, Taipei (TW)

(72) Inventors: Jen-Yu Hsu, Hsinchu (TW);
Kuang-Jung Chang, Hsinchu (TW);
Chia-Hua Liu, Hsinchu (TW);
Chao-Ton Yang, Hsinchu (TW); Sin-Yu Lin, Hsinchu (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 14/187,659

(22) Filed: Feb. 24, 2014

(65) Prior Publication Data
US 2015/0109859 A1    Apr. 23, 2015

(30) Foreign Application Priority Data
Oct. 18, 2013    (CN) .......................... 2013 1 0491522

(51) Int. Cl.
*G11C 7/00* (2006.01)
*G11C 16/30* (2006.01)

(52) U.S. Cl.
CPC .................................... *G11C 16/30* (2013.01)

(58) Field of Classification Search
USPC ............................................. 365/185.03, 222
See application file for complete search history.

(56) References Cited

U.S. PATENT DOCUMENTS

| | | | |
|---|---|---|---|
| 2010/0228922 A1* | 9/2010 | Limaye | ......................... 711/135 |
| 2014/0068313 A1* | 3/2014 | Shimpuku | ...................... 713/340 |

\* cited by examiner

*Primary Examiner* — Anthan Tran
(74) *Attorney, Agent, or Firm* — WPAT, PC; Justin King

(57) ABSTRACT

An electronic device with a solid state drive and associated control method are provided. The electronic device includes: a host; a power supply component, for providing electric power to the host and the solid state drive; and the solid state drive including a control unit electrically connected to the host through a bus, a cache memory electrically connected to the control component, and a flash memory electrically connected to the control component. When a remaining power of the power supply component decreases to a threshold value, the host controls the solid state drive to enter a data secure mode and disables the cache memory; and when the remaining power of the power supply component is above the threshold value, the host controls the solid state drive to enter a high performance mode and enables the cache memory.

9 Claims, 3 Drawing Sheets

ELECTRONIC DEVICE WITH SOLID STATE DRIVE AND ASSOCIATED CONTROL METHOD

This application claims the benefit of People's Republic of China Application Ser. No. 201310491522.1, filed Oct. 18, 2013, the subject matter of which is incorporated herein by reference.

FIELD OF THE INVENTION

The present invention relates to an electronic device and associated control method thereof, and more particularly to an electronic device with solid state drive and associated control method.

BACKGROUND OF THE INVENTION

Due to development of technology and consumers' requirement, handheld electronic devices nowadays provide multi-functions. Take a smart phone for example, instead of providing only basic features, advanced functions such as internet, e-mail, photographing, and video recording functions are always provided as well. Consequently, power consumption of each component in the handheld electronic device should be strictly managed in order to extend standby duration of the electronic device.

Basically, current electronic devices are equipped with solid state drive (hereinafter, SSD) components to save data such as files, programs, pictures, videos and so forth. Such solid state drives are thus named as embedded multi-media card (hereinafter, eMMC).

SSD components use NAND flash memory. As flash memory is non-volatile, data saved to the SSD components are reserved even if the electronic device is shut down.

FIG. 1 is a schematic diagram illustrating connections between a host and a solid state drive in a conventional electronic device. In the electronic device 100, the solid state drive 110 is electrically connected to the host 112 through a bus 120, for receiving a read command or a write command generated by the host 112. The host 112 may be a control processing unit (hereinafter, CPU), and the bus 120 may be a USB bus, an IEEE 1394 bus, or SATA bus etc.

Furthermore, the solid state drive 110 includes a control unit 101, a cache memory 103, and a flash memory 105. Being utilized by the control unit 101, the bus 120 transmits commands and data between the control unit 101 and the host 112. The control unit 101 accesses data stored in the flash memory 105 according to the commands sent from the host 112. Besides, the cache memory 103 is electrically connected to the control unit 101 and used as a temporary buffer for temporarily storing the write data from the host 112, and the read data required by the host 112.

The solid state drive 110 is one of the numerous components in the electronic device. Thus, an important purpose of the present invention is to efficiently manage power consumption of the solid state drive 110 while providing efficient operation between the solid state drive 110 and the host 112 and securing safety of the stored data.

SUMMARY OF THE INVENTION

An embodiment of the present invention provides an electronic device with a solid state drive. The electronic device includes a host, a power supply component and the solid state drive. The power supply component provides power to the host and the solid state drive. The solid state drive includes a control unit, a cache memory, and a flash memory. The control unit is electrically connected to the host through a bus, and electrically connected to the cache memory and the flash memory. When remaining power of the power supply component decreases to a threshold value, the host controls the solid state drive to enter a data secure mode and disables the cache memory. When the remaining power of the power supply component is above the threshold value, the host controls the solid state drive to enter a high performance mode and enables the cache memory.

Another embodiment of the present invention provides a control method applied to an electronic device with a solid state drive. The control method includes following steps. Whether a remaining power of a power supply component in the electronic device is decreased to a threshold value is firstly detected. The solid state drive is then controlled to enter a data secure mode in which a cache memory in the solid state drive is disabled. When the remaining power of the power supply component is above the threshold value, the solid state drive is controlled to enter a high performance mode and the cache memory is enabled.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Details of operation modes of the solid state drive, and an efficient control method between the solid state drive and the host are illustrated below.

Figure 1:
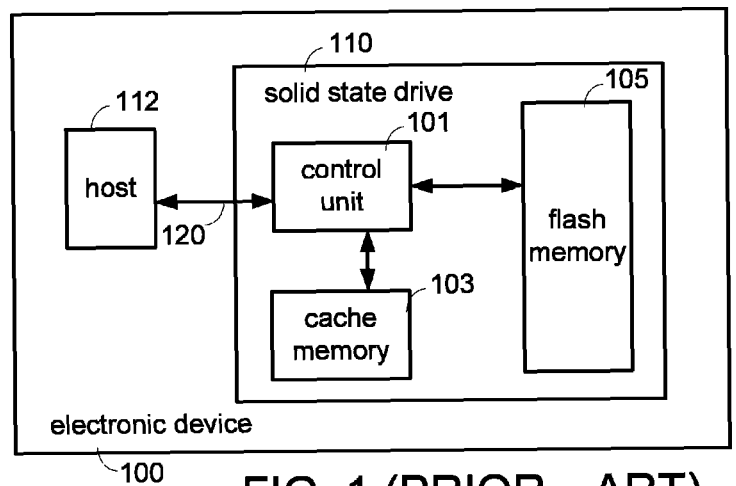
FIG. 1 (prior art) is a schematic diagram illustrating connections between a host and a solid state drive in a conventional electronic device.
Figure 2:
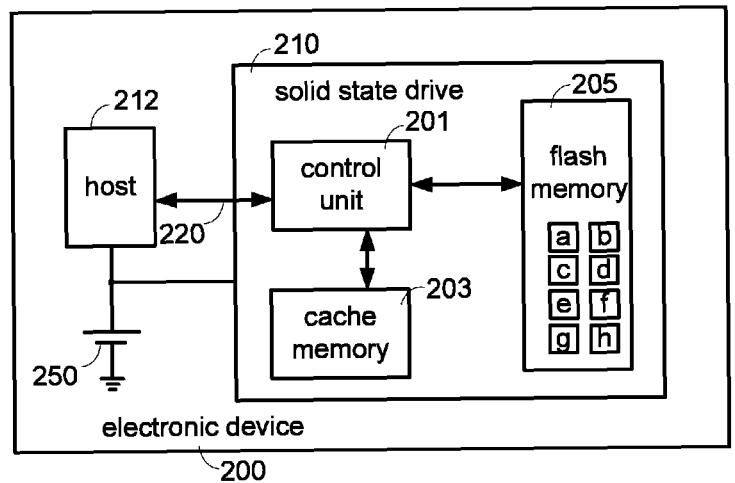
FIG. 2 is a schematic diagram illustrating connections between a host and a solid state drive in an electronic device according to the present invention.

FIG. 2 is a schematic diagram illustrating connections between a host and a solid state drive in an electronic device according to the present invention. In the electronic device 200, the solid state drive 210 is electrically connected to the host 212 through a bus 220, for receiving read commands and/or write commands generated and sent from the host 212. The host 212 may be a CPU and the bus may be a USB bus, an IEEE 1394 bus, or a SATA bus etc. The electronic device 200 further includes a power supply component 250 which provides electric power to the host 212 and the solid state storage 210.

Moreover, the power supply component 250 may be a battery. The battery provides electric power to the host 212 and the solid state drive 210. The solid state drive 210 includes a control unit 201, a cache memory 203, and a flash memory 205. The bus 220 is utilized by the control unit 201 to transmit commands and data from the host 212. Accordingly, the control unit 201 accesses data stored in the flash memory 205 according to commands sent from the host 212. In addition, the cache memory 203 is electrically connected to the control unit 201 for temporarily storing write data transmitted from the host 212, and the read data required by the host 212.

Furthermore, the control unit 201 of the solid state drive 210 writes data to the flash memory 205 in units called pages. Actual size of the pages may be defined by manufacturer of the flash memory 205. For instance, size of each page may be 2K bytes, 4K bytes, or 8K bytes.

According to an embodiment of the present invention shown in FIG. 2, the flash memory 205 contains plural multiple-level cell (hereinafter, MLC) dies a to h. For example, storage capacity of each of the MLC dies is assumed to be 2 G bytes, and storage capacity of the flash memory 205 is 16 G bytes. In some cases, the flash memory 205 may contain plural triple-level cell (hereinafter, TLC) dies a to h. The number of dies is also defined by manufacture of the flash memory 205.

In general, the flash memory can be classified as a single-level cell (hereinafter, SLC), a multiple-level cell, and a triple-level cell according to storage capacity of each memory cell. A SLC type memory cell is capable of saving 1 bit of data, a MLC type memory cell is capable of saving 2 bits of data; and a TLC type memory cell is capable of saving 3 bits of data. Consequently, storage capacity of MLC memory cell is higher than that of SLC memory cell. Similarly, storage capacity of TLC memory cell is higher than that of MLC memory cell. Detail illustrations about characteristics of the solid state drive 210 and the control methods related to the present invention are illustrated below.

Control method of the cache memory 203 is firstly illustrated. Take data writing for instance, when the solid state drive 210 receives the write command and the write data from the host 212, writing behavior and power consumption of the solid state drive 210 will vary according to whether the cache memory 203 is enabled.

When the cache memory 203 is disabled, the solid state drive 210 is in an operation mode of force unit access (hereinafter, FUA). In the operation mode of FUA, the control unit 201 writes the write data to the flash memory 205 immediately after receiving the write command and the write data from the host 212.

When the write data are all written to the flash memory 205, the control unit 201 replies to the host 212 that the write command is completely done. Then, the host 212 sends another write command and write data to the solid state drive 210.

Figure 3A:
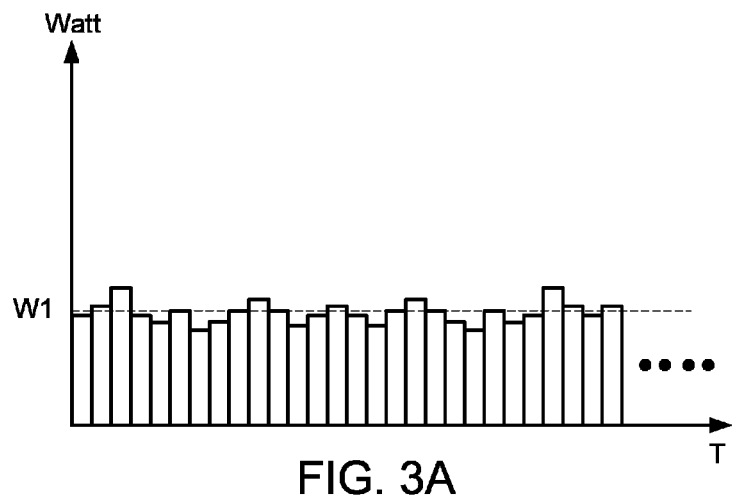
FIG. 3A is a schematic diagram illustrating power consumption of the solid state drive when the host transmits continuous write command in a case that the cache memory is disabled.

FIG. 3A is a schematic diagram illustrating power consumption of the solid state drive when the host continuously transmits write command in a case that the cache memory is disabled. As shown in FIG. 3A, the control unit 201 has to continuously and directly write data to the flash memory 205 when the host 212 continuously generates the write command. Average power consumption of the solid state drive 210 is W1 watt when the solid state drive 210 continuously precedes the writing operation.

Besides, as amount of the write data from the host 212 is unpredictable, the control unit 201 has to insert some dummy data appended after the write data at times. That is, the control unit 201 writes data to the flash memory 205 only when the total amount of the write data and the dummy data is equivalent to a page.

Therefore, when the cache memory 203 is disabled, performance of the writing efficiency is worse and value of write amplification is greater. In addition, as the write data have been written to the flash memory 205, the ability of sudden power off recovery (hereinafter, SPOR) of the flash memory 205 is better when the solid state drive 210 encounters sudden power off. In other words, data loss caused in the solid state drive 210 is less when sudden power off happens.

Besides, when the cache memory 203 is enabled, the control unit 201 immediately replies to the host 112 that the write command is completed after the write data are temporarily stored in the cache memory 203. Consequently, the host 112 may continuously generate and transmit next write command and write data.

When the amount of write data accumulated in the cache memory 203 reaches to a specified amount, the control unit 201 writes all the contents in the cache memory 203 to the flash memory 205.

Figure 3B:
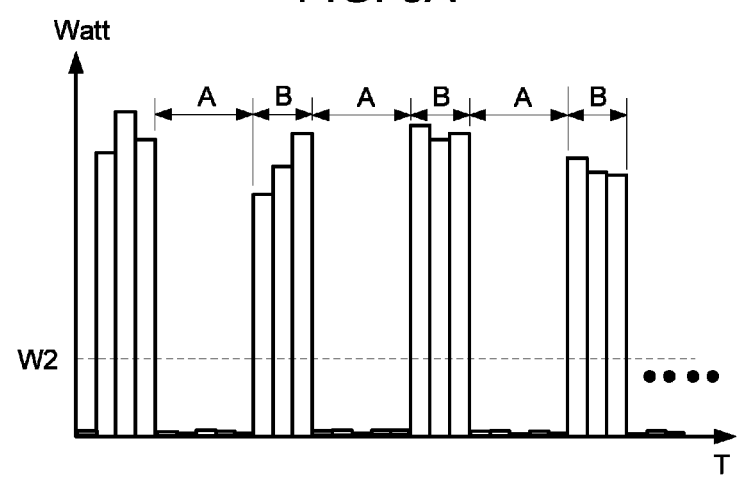
FIG. 3B is a schematic diagram illustrating power consumption of the solid state drive when the host transmits continuous write command in a case that the cache memory is enabled.

FIG. 3B is a schematic diagram illustrating power consumption of the solid state drive when the host transmits continuous write command in a case that the cache memory is enabled. During period A, the cache memory 203 accumulates the write data, and the control unit 201 does not write the write data to the flash memory 205. Thus, the power consumption of the solid state drive 210 is extremely low in period A. During period B, the write data is written from the cache memory 203 to the flash memory 205, and the control unit 201 executes writing operation with highest speed. Thus, the power consumption of the solid state drive 210 is relatively higher in period B.

As indicated in FIG. 3B, when the cache memory 203 is enabled and the solid state drive 210 continuously proceeds wiring operation, the average power consumption of the solid state drive 210 is W2 watt. With same conditions, the average power consumption of the solid state drive 210 in a case that the cache memory is enabled (W2) is less than a case that the cache memory is disabled (W1).

In addition, the write data will be written to the flash memory only after the amount of write data accumulated in the cache memory 203 reaches to a specific amount. Therefore, when the cache memory 203 is enabled, performance of writing operation is higher, and the value of the write amplification is less.

Furthermore, when sudden power off happens, the write data temporarily stored in the cache memory 203 are not yet written to the flash memory 205. Thus the write data stored in the cache memory 203 will disappear due to the sudden power off. In other words, ability of SPOR of the solid state drive 210 is worse when the cache memory 203 is enabled. Consequently, amount of data loss is more when sudden power off happens.

Data backup control method of the flash memory is secondly discussed below. While executing writing operation, the control unit 201 writes data to the flash memory 205 in pages. When the flash memory 205 is composed of MLC dies a to h, pages in the flash memory 205 can be grouped as a lower page and an upper page. The control unit 201 is required to write data to the lower page prior to the upper page during writing operation.

Based on the characteristics of the flash memory 205, even if the write data have been written to the lower page, the write data in the lower page may still be affected while the control unit 201 writes data to the upper page. If the sudden power off happens when the control unit 201 writes data to the upper page, write data in both the upper page and the lower page will be damaged and unable to be recovered. Therefore, the solid state drive 210 provides data backup setting for the flash memory 205 composed of MLC dies a to h.

For example, in a case that the backup setting of the solid state drive 210 is enabled, an identical copy of the write data will be backed up in another MLC die (such as the lower page of MLC die "b") when the control unit 201 writes data to the lower page of MLC die "a". Therefore, when sudden power off happens during the process that the control unit 201 writes data to the upper page of MLC die "a", the write data in the lower page of MLC die "a" can be recovered by referring to the lower page of the MLC die "b".

In a case that the backup setting of the solid state drive 210 is disabled, no back up of the write data in the lower page of MLC die "a" will be generated nor written to another MLC die. Consequently, when sudden power off happens during the process that the control unit 201 writes data to the upper page of MLC die "a", the write data in the lower page of MLC die "a" will be damaged and unable to be recovered.

Based on the above illustration, when the backup function of the solid state drive 210 is enabled, capability of sudden power off recovery is better. However, the solid state drive 210 consumes more power when the back up function is enabled. On the other hand, when the backup function of the solid state drive 210 is disabled, the capability of sudden power off recovery is relatively weak. However, the solid state drive 210 consumes less power when the backup function is disabled.

Similarly, when the flash memory 205 is composed of TLC dies a to h, pages in the flash memory 205 can be classified as lower pages, middle pages and upper pages. The control unit 201 is required to write the pages in a sequence of the lower pages, the middle pages, and the upper pages. Similarly, when the data backup function of the solid state drive 210 is enabled, data written to the lower page and the middle page are required to be backed up for preventing the data from being damaged due to the sudden power off. On the other hand, when the backup function of the solid state drive 210 is disabled, data being written in the lower page and the middle page will not be backed up, and will not be able to be recovered when sudden power off occurs.

Based on the characteristics of the solid state drive 210 mentioned above, control method applied to electronic device 200 with solid state drive 210 is developed according to the present invention. Details of the embodiments according to the present invention are illustrated below.

Figure 4A:
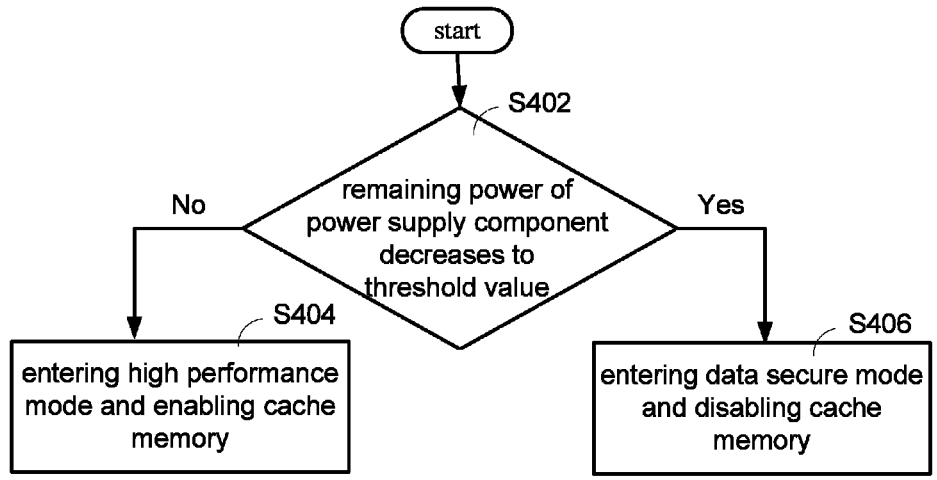
FIG. 4A is a schematic diagram illustrating a first embodiment of the control method applied to the electronic device.

FIG. 4A is a schematic diagram illustrating a first embodiment of the control method applied to the electronic device. When the electronic device 200 starts to operate, the host 212 may detect remaining power of the power supply component 250 (step S402). When the remaining power of the power supply component 250 is detected to be lower or equivalent to a threshold value, the electronic device 200 enters a data secure mode and the cache memory 203 is disabled (step S406). On the other hand, when the remaining power of the power supply component 250 is above the threshold value, the electronic device 200 enters a high performance mode and the cache memory 203 is enabled (step S404).

As the power supply component 250 (e.g. battery) of present electronic device 200 is always well protected by the housing of the electronic device 200, the possibility that the power supply unit 250 falls off the electronic device 200 is very low. Therefore, except that the electric power provided by the power supply unit 250 is consumed out completely, the sudden power off seldom happens.

Therefore, when the remaining power of the power supply component 250 is above the threshold value (e.g. 20% of the battery capability), the possibility of sudden power off is extremely low. Under such circumstances, the problem that the solid state drive 210 is with low ability of SPOR can be neglected. Hence, the host 212 can control the solid state drive 210 to enter the high performance mode.

According to the first embodiment, the cache memory 203 is enabled in the high performance mode. Thus, the writing efficiency of the solid state drive 210 is higher; the value of write amplification is less; and the solid state drive 210 consumes less power.

On the other hand, when the remaining power of the power supply component 250 is less than the threshold value (e.g. 20% of the battery capability), unexpected sudden power off may occur. In such case, the problem that the solid state drive 210 is with low ability of SPOR should be considered. Thus, the host 212 controls the solid state drive 210 to enter the data secure mode.

According to the first embodiment, the cache memory 203 is disabled in the data secure mode. At this stage, the writing efficiency of the solid state drive 210 is lower; the value of write amplification is greater; and the solid state drive 210 consumes more power. However, reliability of the write data is relatively higher.

Figure 4B:
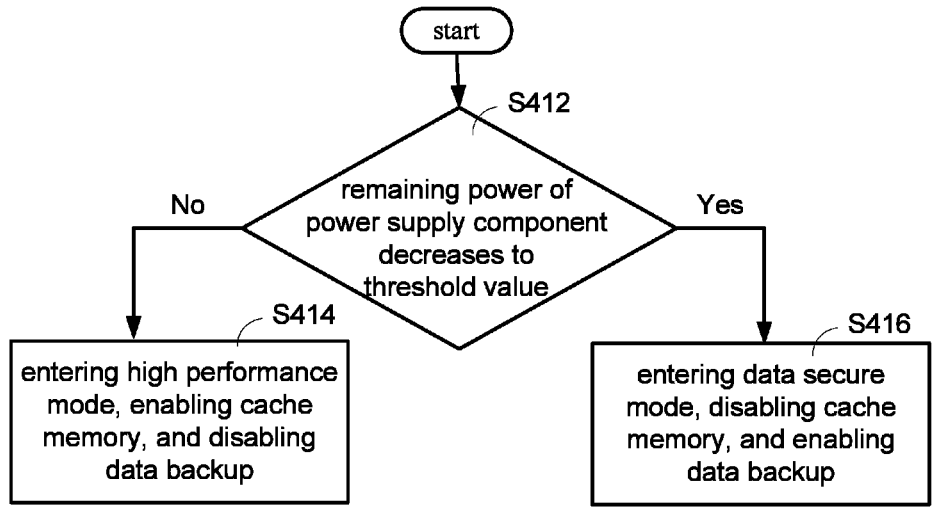
FIG. 4B is a schematic diagram illustrating a second embodiment of the control method applied to the electronic device.

FIG. 4B is a schematic diagram illustrating a second embodiment of the control method applied to the electronic device. When the electronic device 200 starts to operate, the host 212 detects the remaining power of the power supply component 250 (step S412). When the remaining power of the power supply component 250 is detected to be lower than or equivalent to a threshold value, the electronic device 200 enters the data secure mode. Meanwhile, the cache memory 203 is disabled and the data backup is enabled (step S416). On the other hand, when the remaining power of the power supply component 250 is detected to be above the threshold value, the electronic device 200 enters the high performance mode. Meanwhile, the cache memory 203 is enabled and the data backup is disabled (step S414).

Similarly, when the remaining power of the power supply component 250 is above the threshold value (e.g. 20% of the battery capability), the possibility of sudden power off is extremely low. Under such circumstances, the problem that the solid state drive 210 is with low ability of SPOR can be neglected. Hence, the host 212 can control the solid state drive 210 to enter the high performance mode.

According to the second embodiment, the cache memory 203 is enabled and the data backup is disabled in the high performance mode. Thus, the writing efficiency of the solid state drive 210 is higher; the value of write amplification is less; and the solid state drive 210 consumes less power.

On the other hand, when the remaining power of the power supply component 250 is less than the threshold value (e.g. 20% of the battery capability), unexpected sudden power off may occur. The problem that the solid state drive 210 is with low ability of SPOR should be considered. Thus, the host 212 controls the solid state drive 210 to enter the data secure mode.

According to the second embodiment, the cache memory 203 is disabled and the data backup is enabled in the data secure mode. At this stage, the writing efficiency of the solid state drive 210 is lower; the value of write amplification is greater; and the solid state drive 210 consumes more power. However, reliability of the write data is relatively higher.

Based on the above illustrations, the electronic device 200 with solid state drive 210 and associated control methods are provided in the present invention. When the host 212 confirms that electric power provided by the power supply component 250 is sufficient, the solid state drive 210 may access data with high performance mode. When the host 212 confirms that the electric power provided by the power supply component 250 is insufficient, the solid state drive 210 preferentially considers data reliability. Moreover, when the power supply component 250 of the electronic device 200 is being charged, the remaining power of the power supply unit 250 is considered to be above the threshold value.

Moreover, the host 212 may provides more efficient data writing method depending on various modes of the solid state drive 210. For instance, the host 212 may transmits packet write command to the solid state drive 210 when the solid state drive 210 enters the high performance mode. That is, the solid state drive 210 stores great amount of write data with high efficiency in the high performance mode. On the other hand, when the host 212 controls the solid state drive 210 to enter the data secure mode, a normal write command is transmitted to the solid state drive 210. That is, the solid state drive 210 preferentially considers data reliability while writing data in the data secure mode.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic device with a solid state drive, comprising:
   a host;
   a power supply component, for providing electric power to the host and the solid state drive; and
   the solid state drive comprising:
      a control unit, electrically connected to the host through a bus;
      a cache memory, electrically connected to the control unit; and
      a flash memory comprising a plurality of memory dies, electrically connected to the control unit,
   wherein when remaining power of the power supply component decreases to a threshold value, the host controls the solid state drive to enter a data secure mode, enable a data backup and disables the cache memory; and
   when the remaining power of the power supply component is above the threshold value, the host controls the solid state drive to enter a high performance mode, disable the data backup and enables the cache memory,
   wherein when the data backup is enabled, the solid state drive writes a write data in one of the memory dies and an identical copy of the write data is backed up in another memory die.

2. The electronic device as claimed in claim 1, wherein the flash memory comprises a plurality of multiple-level cell memory dies; or the flash memory comprises a plurality of triple-level cell memory dies.

3. The electronic device as claimed in claim 1, wherein when the solid state drive enters the high performance mode, the host transmits a packet write command to the solid state drive; and when the solid state drive enters the data secure mode, the host transmits a normal write command to the solid state drive.

4. The electronic device as claimed in claim 1, wherein when the power supply component is being charged, the remaining power is considered to be above the threshold value.

5. A control method applied to an electronic device with a solid state drive having a flash memory comprising a plurality of memory dies, comprising steps of:
   detecting whether a remaining power of a power supply component in the electronic device is decreased to a threshold value;
   when the remaining power of the power supply component is decreased to the threshold value, controlling the solid state drive to enter a data secure modes, enable a data backup and disabling a cache memory in the solid state drive; and
   when the remaining power of the power supply component is above the threshold value, controlling the solid state drive to enter a high performance mode, disabling the data backup and enabling the cache memory,
   wherein when the data backup is enabled, the solid state drive writes a write data in one of the memory dies and an identical copy of the write data is backed up in another memory die.

6. The control method as claimed in claim 5, wherein the flash memory comprising a plurality of multiple-level cell memory dies,
   when the data backup is enabled, the solid state drive writes the write data in a lower page of the flash memory in one of the memory dies and the identical copy of the write data is backed up in a lower page of the flash memory in another memory die.

7. The control method as claimed in claim 5, wherein the flash memory comprising a plurality of triple-level cell memory dies,
   when the data backup is enabled, the solid state drive writes the write data in a lower page or middle page of the flash memory in one of the memory dies and the identical copy of the write data is backed up in a lower page or middle page of the flash memory in another memory die.

8. The control method as claimed in claim 5, wherein when the solid state drive enters the high performance mode, a host of the electronic device transmits a packet write command to the solid state drive; and when the solid state drive enters the data secure mode, the host transmits a normal write command to the solid state drive.

9. The control method as claimed in claim 5, wherein when the power supply component is being charged, the remaining power is considered to be above the threshold value.

* * * * *